US012424490B2

(12) United States Patent
Blanquart et al.

(10) Patent No.: US 12,424,490 B2
(45) Date of Patent: Sep. 23, 2025

(54) HALOGENATION-BASED GAPFILL METHOD AND SYSTEM

(71) Applicant: ASM IP Holding B.V., Almere (NL)

(72) Inventors: Timothee Blanquart, Oud-Heverlee (BE); René Henricus Jozef Vervuurt, Leuven (BE); Jihee Jeon, Leuven (BE)

(73) Assignee: ASM IP Holding B.V., Almere (NL)

(*) Notice: Subject to any disclaimer, the term of this patent is extended or adjusted under 35 U.S.C. 154(b) by 519 days.

(21) Appl. No.: 17/953,502

(22) Filed: Sep. 27, 2022

(65) Prior Publication Data

US 2023/0115806 A1 Apr. 13, 2023

Related U.S. Application Data

(60) Provisional application No. 63/250,326, filed on Sep. 30, 2021.

(51) Int. Cl.
*H01L 21/768* (2006.01)
*H01L 21/02* (2006.01)

(52) U.S. Cl.
CPC .. *H01L 21/76837* (2013.01); *H01L 21/02112* (2013.01); *H01L 21/0228* (2013.01); *H01L 21/76877* (2013.01)

(58) Field of Classification Search
CPC ............... H01L 21/76882; H01L 21/76837
See application file for complete search history.

(56) References Cited

U.S. PATENT DOCUMENTS

| | | | |
|---|---|---|---|
| 2001/0041439 A1* | 11/2001 | Batra ................ | H01L 21/76877 438/631 |
| 2019/0115255 A1* | 4/2019 | Kazem ............. | H01L 21/76877 |
| 2022/0119944 A1* | 4/2022 | Yoshimoto ............. | C23C 16/46 |
| 2022/0223411 A1* | 7/2022 | Blanquart ................ | B05D 1/62 |
| 2022/0285211 A1* | 9/2022 | Färm ................ | H01L 21/28562 |
| 2022/0293463 A1* | 9/2022 | Vervuurt ........... | H01L 21/02112 |
| 2022/0319834 A1* | 10/2022 | Vervuurt ............. | H01L 21/0228 |
| 2023/0095086 A1* | 3/2023 | Blanquart ......... | H01L 21/32055 438/436 |
| 2023/0096062 A1* | 3/2023 | Blanquart ......... | H01L 21/47635 438/584 |
| 2023/0098575 A1* | 3/2023 | Dezelah .................. | C23C 16/08 427/253 |

(Continued)

FOREIGN PATENT DOCUMENTS

KR 20040008726 A * 1/2004

OTHER PUBLICATIONS

KR-20040008726-A Machine Translation (Year: 2004).*

*Primary Examiner* — Erik Kielin
(74) *Attorney, Agent, or Firm* — Snell & Wilmer L.L.P.

(57) ABSTRACT

A method and system for forming material within a gap on a surface of a substrate are disclosed. An exemplary method includes forming a material layer on a surface of the substrate within a first reaction chamber, exposing the material layer to a halogen reactant in a second reaction chamber to thereby form a flowable layer comprising a halogen within the gap, and optionally exposing the flowable layer to a converting reactant in a third reaction chamber to form a converted material within the gap. Exemplary methods can further include a step of heat treating the flowable layer or the converted material. Exemplary systems can perform the method.

13 Claims, 7 Drawing Sheets

(56) References Cited

U.S. PATENT DOCUMENTS

| | | | |
|---|---|---|---|
| 2023/0101229 A1* | 3/2023 | Huotari | H01L 21/76832 |
| | | | 438/424 |
| 2025/0051925 A1* | 2/2025 | Blanquart | C23C 16/045 |
| 2025/0066905 A1* | 2/2025 | Vervuurt | C23C 16/56 |

* cited by examiner

HALOGENATION-BASED GAPFILL METHOD AND SYSTEM

CROSS-REFERENCE TO RELATED APPLICATIONS

This application claims priority to U.S. Provisional Patent Application Ser. No. 63/250,326, filed Sep. 30, 2021, and titled HALOGENATION-BASED GAPFILL METHOD AND SYSTEM, the disclosure of which is hereby incorporated by reference in its entirety.

FIELD OF DISCLOSURE

The present disclosure generally relates to methods and systems used in the formation of electronic devices. More particularly, the disclosure relates to methods and systems suitable for at least partially filling gaps on a surface of a substrate during the manufacture of devices.

BACKGROUND OF THE DISCLOSURE

The scaling of semiconductor devices has led to significant improvements in speed and density of integrated circuits. However, conventional device scaling techniques face significant challenges for future technology nodes. In particular, with miniaturization device features, void-free filling of high aspect ratio gaps (e.g., having an aspect ratio of three or higher) with desired material becomes increasingly challenging due to limitations of existing deposition processes.

While some techniques have been developed to provide material within a gap, such methods may not provide desired material within the gap (i.e., material with desired properties, such as etch resistance, chemical-mechanical polishing resistance, insulating properties, or the like). Further, there is a general desire to perform methods suitable for filling gaps on a substrate surface with a reduced number of processing systems and/or in a time-efficient manner. Accordingly, improved methods and systems for providing desired material within a gap while mitigating void formation within the material are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods and systems for providing material within a gap—e.g., at least partially filling the gap with desired material. As set forth in more detail below, exemplary methods include depositing material, forming flowable material from the deposited material, and converting the flowable material to the desired material within the gap. Exemplary methods may not include all of these steps and/or may include additional steps.

In accordance with embodiments of the disclosure, a method of filling a gap on a surface of a substrate is provided. Exemplary methods include providing a substrate, forming a material layer on a surface of the substrate, exposing the material layer to a halogen reactant to thereby form a flowable layer, and exposing the flowable layer to a converting reactant to form a converted material within the gap. In accordance with various examples of these embodiments, the step of forming a material layer on a surface of the substrate is performed within a first reaction chamber, the step of exposing the material layer to the halogen reactant is performed in a second reaction chamber, and the step of exposing the flowable layer to a converting reactant to form a converted material within the gap is performed in a third reaction chamber. The first, second, third, and optionally a fourth reaction chamber can form part of a reactor system (e.g., a cluster tool) and/or a process module. Exemplary methods can further include a step of heat-treating the converted material in the fourth reaction chamber of the reactor system. In accordance with yet further examples of these embodiments, a cycle includes the steps of forming the material layer on the surface of the substrate within the first reaction chamber, exposing the substrate to the halogen reactant in the second reaction chamber, exposing the substrate to the converting reactant in the third reaction chamber, and heat-treating the converted material in the fourth reaction chamber, and the cycle is repeated one or more times. By performing two or more (e.g., all) of the method steps within the same reactor system, the method steps can be performed without an air break. Further, multiple cycles can be readily and rapidly performed. In accordance with further examples, the halogen reactant includes activated species; the activated species can be formed using a remote plasma unit fluidly coupled to the second reaction chamber, using a direct plasma, and/or using an indirect plasma. In accordance with yet further examples, the converting reactant comprises one or more of noble gasses, nitrogen-containing gasses, oxygen-containing gasses, carbon-containing gasses, and hydrogen-containing gasses.

In accordance with additional embodiments of the disclosure, a multi-chamber reactor system is provided. An exemplary multi-chamber reactor system includes at least three reaction chambers: a first reaction chamber configured to deposit a material layer, a second reaction chamber configured to expose the material layer to a halogen reactant to thereby form a flowable layer, and a third reaction chamber configured to expose the flowable layer to a converting reactant in a third reaction chamber to form a converted material. The multi-chamber reactor system can include a fourth reaction chamber configured to heat treat the converted material. In accordance with examples of these embodiments, the first reaction chamber, the second reaction chamber, the third reaction chamber, and optionally the fourth reaction chamber form part of a cluster tool or process module, wherein a substrate moves between the first reaction chamber, the second reaction chamber, the third reaction chamber, and optionally the fourth reaction chamber without an air break. As discussed in more detail below, the reactor system can include one or more plasma systems to activate a reactant. Further, the reactor system can include one or more controllers to perform a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
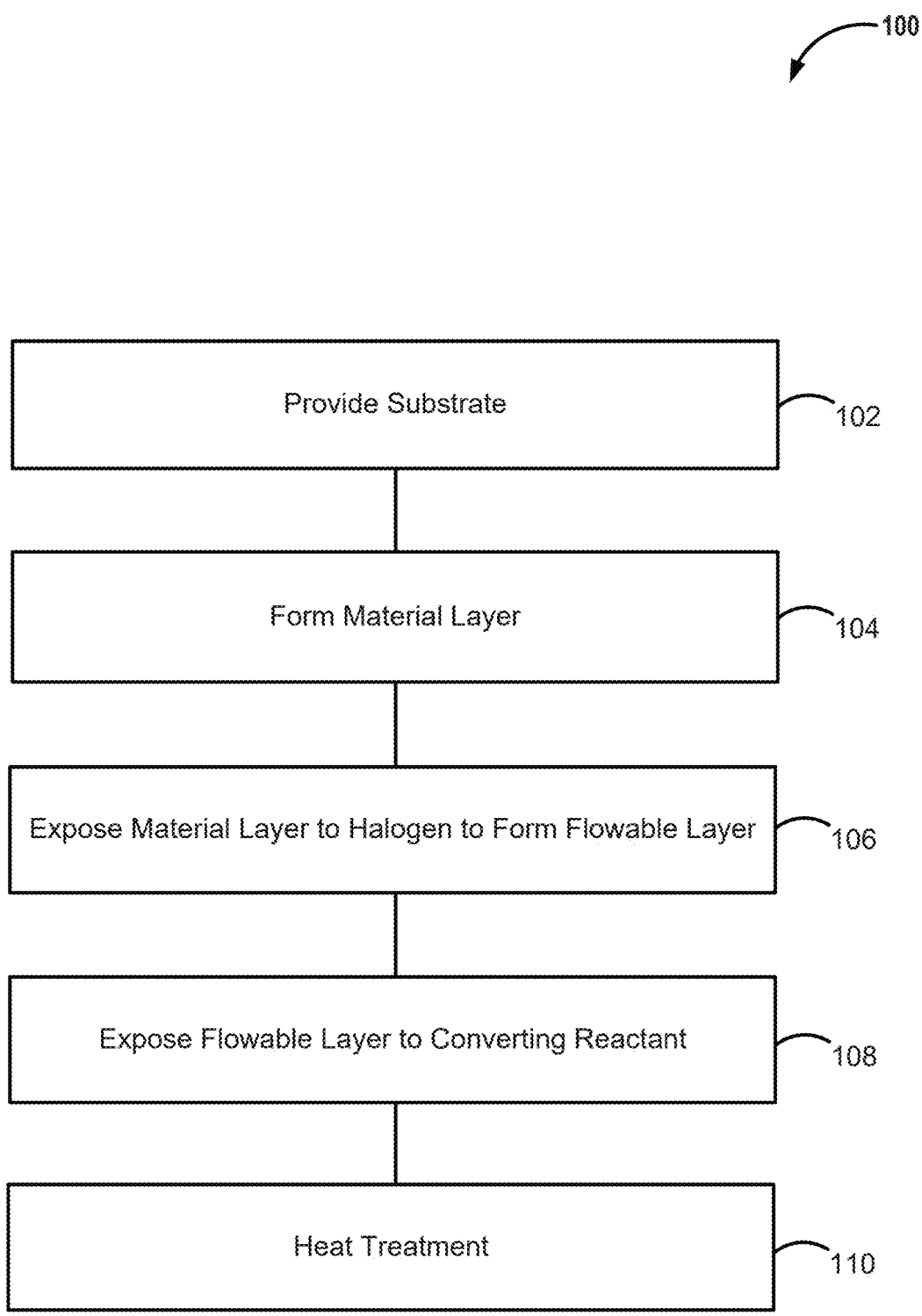
FIG. 1 illustrates a method in accordance with examples of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The present disclosure provides improved methods and systems for at least partially filling a gap with material. The methods and systems can be used to fill the gap with desired material in a cost-effective manner, using less equipment, and/or in a time-efficient manner, compared to other methods. Further, methods and systems described herein can be used to fill gaps with the desired material in a void-free manner—e.g., from the bottom up.

In this disclosure, "gas" can include material that is a gas at normal temperature and pressure (NTP), a vaporized solid and/or a vaporized liquid, and can be constituted by a single gas or a mixture of gasses, depending on the context. A gas other than the process gas, i.e., a gas introduced without passing through a gas distribution assembly, other gas distribution device, or the like, can be used for, e.g., sealing the reaction space, and can include a seal gas. Exemplary seal gasses include noble gasses, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor. In some cases, a reactant reacts with a precursor or derivative thereof to form a film or layer.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate. A film or layer may comprise material or a layer with pinholes and/or isolated islands. A film or layer may be at least partially continuous.

As used herein, a "structure" can be or can include a substrate as described herein. Structures can include one or more layers overlying the substrate, such as one or more layers formed according to a method as described herein.

The term "deposition process" as used herein can refer to the introduction of precursors (and/or reactants) into a reaction chamber to deposit or form a layer over a substrate. "Cyclical deposition processes" are examples of "deposition processes."

The term "cyclic deposition process" or "cyclical deposition process" can refer to the sequential introduction of precursors (and/or reactants) into a reaction chamber to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced into a reaction chamber and is chemisorbed onto a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas (which can include a non-activated reactant in some cases) is provided to a reaction chamber in between two pulses of gasses that react with each other. For example, a purge, e.g., using a noble gas, may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reaction chamber, providing a purge gas to the reaction chamber, and providing a reactant to the reaction chamber, wherein the substrate on which a layer is deposited does not move. For example, in the case of spatial purges, a purge step can take the following form: moving a substrate from a first location to which a first precursor is continually supplied, through a purge gas curtain, to a second location to which a reactant is continually supplied.

As used herein, a "precursor" includes a gas or a material that can become gaseous and that can be represented by a chemical formula that includes an element which may be incorporated during a deposition process as described herein.

The term "halogen reactant" can refer to a gas or a material that can become gaseous and that can be represented by a chemical formula that includes a halogen, such as F, Cl, Br, and/or I. In some cases, the chemical formula includes oxygen and/or hydrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As used herein, the term "comprising" indicates that certain features are included, but that it does not exclude the presence of other features, as long as they do not render the claim or embodiment unworkable. In some embodiments, the term "comprising" includes "consisting of" or "consisting essentially of." As used herein, the term "consisting of" indicates that no further features are present in the apparatus/method/product apart from the ones following said wording. When the term "consisting of" is used, referring to a chemical compound, it indicates that the chemical compound only contains the components which are listed.

In this disclosure, the term "filling capability" refers to a capability of filling a gap substantially without voids (e.g., no void having a size of approximately 5 nm or greater in diameter) and seams (e.g., no seam having a length of approximately 5 nm or greater), wherein seamless/void-less bottom-up growth of a layer is observed. The growth at the bottom of a gap may be at least approximately 1.5 times faster than growth on sidewalls of the gap and on a top surface of the gap. This disclosure provides methods and systems for depositing material with filling capability, i.e., material that preferentially fills a gap from the bottom up.

In this disclosure, a recess between adjacent protruding structures and any other recess pattern may be referred to as a "gap." That is, a gap may refer to any recess pattern, including a hole/via, region between lines, and the like. A gap can have, in some embodiments, a width of about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a gap has an aspect ratio of about 2 to about 10, and typically of about 2 to about 5. The dimensions of the gap may vary depending on process conditions, film composition, intended application, and the like.

As used herein, the term "height" may refer to the extent of a gap in a direction in a plane perpendicular to the surface of the substrate that comprises the gap in question.

As used herein, the term "width" may refer to the extent of a gap in a direction in a plane parallel to the surface of the substrate that comprises the gap in question.

As used herein, the term "length" may refer to the extent of a gap in a direction in a plane parallel to the surface of the substrate that comprises the gap in question. The directions in which the "width" and the "length" are measured are generally mutually perpendicular. It shall be understood that all dimensions, including length, width, and height of a structure, can be measured using routine techniques, such as scanning transmission electron microscopy (STEM).

In this disclosure, any defined meanings do not necessarily exclude ordinary and customary meanings, in some embodiments.

An improved method for filling a gap is provided in accordance with examples of the disclosure. An exemplary method comprises introducing a substrate provided with a gap into a reaction chamber. Exemplary gaps include recesses, contact holes, vias, trenches, and the like. The gap comprises a distal part and a proximal part. The distal part comprises a distal surface. The proximal part comprises a proximal surface. It shall be understood that the gap does not necessarily have to be oriented vertically, but can extend in a horizontal direction. It shall be understood that the proximal part of the gap is the part of the gap that is closest to the substrate surface in which the gap forms a recess, and the distal part of the gap is the part of the gap that is most distant from that surface.

Turning now to the figures, FIG. 1 illustrates a method 100 in accordance with examples of the disclosure. FIGS. 2-5 illustrate structures formed using method 100. As illustrated, method 100 includes the step of providing a substrate within a first reaction chamber (step 102); forming a material layer on a surface of the substrate within the first reaction chamber (step 104); exposing the material layer to a halogen reactant in a second reaction chamber (step 106); and exposing the flowable layer to a converting reactant in a third reaction chamber to form a converted material within the gap (step 108). Although separately illustrated, some steps of method 100 can be combined or can overlap. As used herein, overlap means performed within the same reaction chamber for a period of time.

As described in more detail below, various steps of method 100 can be performed within a single reactor system—e.g., within multiple reaction chambers of a single reactor system or cluster tool or process module. Exemplary reactor systems and reaction chambers are described in more detail below in connection with FIGS. 6-10. Using a single reactor system to perform method 100 is advantageous, because it allows performance of multiple steps without exposing the substrate to an air break between steps. For example, the steps of forming the material layer on the surface of the substrate within the first reaction chamber, exposing the substrate to the halogen reactant in the second reaction chamber, exposing the substrate to the converting reactant in the third reaction chamber, and heat-treating the converted material in the fourth reaction chamber can be performed without an air break.

During step 102, a substrate comprising a gap is provided, e.g., into a (e.g., first) reaction chamber (e.g., of a first reactor) of a reactor system. In accordance with examples of the disclosure, the first reaction chamber can form part of a gas-phase reactor, such as a cyclical deposition reactor, such as an atomic layer deposition (ALD) reactor, a CVD reactor, or the like. A type of reactor may depend on the material deposited during step 104. Optionally, a reactor including the reaction chamber can be provided with a heater to activate the reactions by elevating the temperature of one or more of the substrate, the reaction chamber wall, and/or the reactants/precursors.

During step 102, the substrate can be brought to a desired temperature and pressure for step 104. While the specific temperatures and pressures can depend on the material deposited, by way of examples, a temperature (e.g., of a substrate or a substrate support) within a reaction chamber can be between about 25° C. and about 150° C. or about 150° C. and about 350° C.; a pressure within the reaction chamber can be about 1 to about 5 or about 5 to about 100 Torr.

During step 104, a material layer is formed on a surface of the substrate within the first reaction chamber. The material layer can be, for example, one or more of a metal, an alloy, a metal oxide, an elemental semiconductor, and a compound semiconductor. A compound semiconductor can be an alloy of two elemental semiconductors, such as SiGe. Alternatively, a compound semiconductor can be a chalcogenide, such as an oxide: CuO, $CuO_2$, InO, or SnO. Or, a compound semiconductor can be a multi-component material, such as indium gallium zinc oxide. By way of examples, the material layer can be or include a metal oxide, a metal nitride or a metal oxynitride. A suitable metal oxide can be represented by $M_xO_y$, where M is a metal, such as one or more of W, Nb, Ta, V, Ti, Zr, Rh, Fe, Cr, Mo, Au, Pt, Ag, Ni, Cu, Co, Zn, Al, In, Sn, or a metalloid, such as one or more of Ge, Sb, Te, and Bi, and where x ranges from about 1 to about 2 and y to about 1 to 5. A suitable metal oxynitride can be represented by $M_xO_yN_z$, where M is a metal is a metal or metalloid as set forth herein, where x ranges from about 0.2 to 1 or 0.2 to 0.98, or 0.2 to 0.98 or 0.1 to 0.3, or 0.3 to 0.5, or 0.5 to 0.8, y ranges from about 0 to about 0.8 or 0.1 to about 0.6. or 0.1 to 0.3, or 0.3 to 0.5, or 0.5 to 0.8, and z ranges from 0 to 0.8, or 0.1 to 0.6 or 0.1 to 0.3, or 0.3 to 0.5, or 0.5 to 0.8. In some cases, the material layer comprises the metal or metalloid as described herein and one or more of O, N, and C. In some embodiments, the material layer comprises an oxide of W, Nb, Ta, V, Ti, Zr, Rh, Fe, Cr, Mo, Au, Pt, Ag, Ni, Cu, Co, Zn, Al, In, or Sn. In some embodiments, the material layer comprises a nitride of W, Nb, Ta, V, Ti, Zr, Rh, Fe, Cr, Mo, Au, Pt, Ag, Ni, Cu, Co, Zn, Al, In, or Sn. In some embodiments, the material layer comprises a carbide of W, Nb, Ta, V, Ti, Zr, Rh, Fe, Cr, Mo, Au, Pt, Ag, Ni, Cu, Co, Zn, Al, In, or Sn. In some embodiments, the material layer comprises an oxynitride of W, Nb, Ta, V, Ti, Zr, Rh, Fe, Cr, Mo, Au, Pt, Ag, Ni, Cu, Co, Zn, Al, In, or Sn. In some embodiments, the material comprises an oxycarbide of W, Nb, Ta, V, Ti, Zr, Rh, Fe, Cr, Mo, Au, Pt, Ag, Ni, Cu, Co, Zn, Al, In, or Sn. In some embodiments, the material layer comprises an oxycarbonitride of W, Nb, Ta, V, Ti, Zr, Rh, Fe, Cr, Mo, Au, Pt, Ag, Ni, Cu, Co, Zn, Al, In, or Sn.

As noted above, the material layer can be deposited using any suitable method. In some cases, the material layer is conformally deposited—e.g., using a cyclical process, such as (e.g., thermal ALD or PEALD. Alternatively, the material layer can be deposited using a non-cyclical process, such as a CVD or PECVD process. In some embodiments, the material layer can be non-conformal. Non-conformal material layers can be formed, for example, by means of a physical vapor deposition (PVD) process such as sputtering or electron beam evaporation.

In some embodiments, a conformally-deposited layer exhibits a step coverage equal to or greater than 50%, or greater than 80%, or greater than 90%, or greater than 100%, or greater than 110%, or greater than 150%, or greater than 200%, in/on structures having aspect ratios (height/width) of more than about 2, more than about 5, more than about 10, more than about 25, more than about 50, more than about 100, or between about 10 and 100 or about 5 and about 25. It shall be understood that the term "step coverage" refers to a thickness of a layer on a distal surface of a recess, divided by the thickness of that layer on a proximal surface of the recess, and is expressed as a percentage. It shall be understood that a distal portion of the gap feature refers to a portion of the gap feature that is relatively far removed from a substrate's surface, and that the proximal portion of a gap feature refers to a part of the gap feature which is closer to the substrate's surface compared to the distal/lower/deeper portion of the gap feature.

Figure 2:
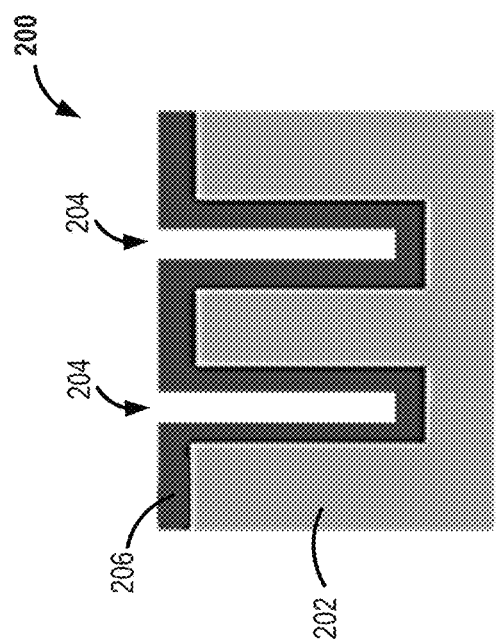

FIG. 2 illustrates a structure 200 that includes a substrate 202 having gaps 204 formed therein. In the illustrated example, a material layer 206 is (e.g., conformally) deposited overlying a surface of substrate 202—including within gaps 204.

By means of a method as disclosed herein, a layer having a desired thickness can be deposited by choosing a suitable amount of deposition cycles or a suitable amount of time. For example, and in some embodiments, the presently described methods can comprise depositing a layer having a thickness of a desired thickness. In some cases, the thickness can be enough to fill or substantially fill a gap once the material flows. In some cases, the thickness can be at most about a critical dimension (e.g., width) of a gap divided by about 2. Thus, a method as described herein may comprise executing a suitable amount of deposition cycles or running for a desired amount of time to obtain a desired material layer thickness.

Once a desired thickness of the material layer (e.g., material layer 206) is deposited, during step 106, the material layer is exposed to a halogen reactant in a second reaction chamber to thereby form a flowable layer comprising a halogen within the gap. Specific process conditions during step 106 can vary depending on, for example, the halogen reactant and/or the material layer. By way of examples, a temperature (e.g., of a substrate or a substrate support) within a reaction chamber can be between about 100° C. and about 800° C. or about 200° C. and about 400° C.; a pressure within the reaction chamber can be about 2 to about 4 or about 5 to about 100 Torr during step 106. In some cases, during step 106, a substrate temperature can be increased to increase a flow of the flowable layer.

As noted above, the halogen reactant can comprise one or more of fluorine, chlorine, bromine, and iodine. In some cases, the halogen reactant comprises activated species. The activated species can be formed using one or more of a remote plasma, a direct plasma, and an indirect plasma.

Suitable active species include radicals and ions, such as radicals or ions comprising or consisting of a halogen such as F, Cl, Br, and I. For example, the halogen reactant can include halogen-containing radicals, for example radicals comprising or consisting of fluorine, chlorine, bromine, and iodine. The radicals can, in some embodiments, be suitably generated using a remote plasma using a halogen-containing process gas, for example a plasma gas comprising a halogen-containing compound or elemental species on the one hand, and a noble gas such as Ar or He on the other hand. Suitable halogen-containing compounds include $NF_3$ and radicals formed from $NF_3$. Other suitable halogen-containing compounds include HF, HCl, $Cl_2$, and $SF_6$. Suitable elemental halogens include $F_2$, $Cl_2$, $Br_2$, and $I_2$. Exemplary apparatus for forming such plasmas are discussed in more detail below. In the case of a remote plasma, a remote plasma unit is fluidly coupled to the second reaction chamber, and activated species from the remote plasma unit are provided to the second reaction chamber during step 106. In the case of indirect and direct plasmas, active species can be formed within the reactor.

Figure 3:
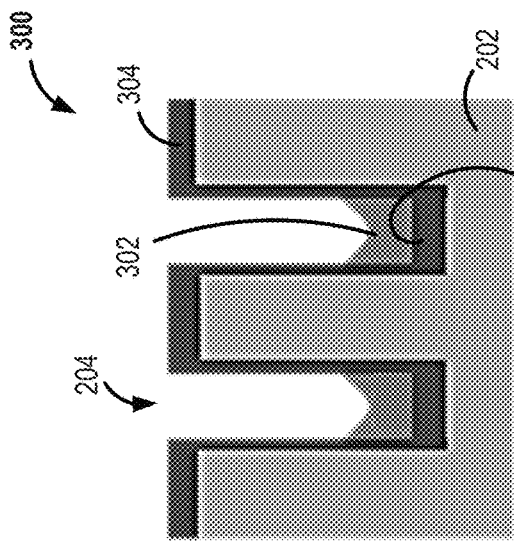
FIGS. 2-5 illustrate structures formed in accordance with examples of the disclosure.

During step 106, a flowable layer is formed. FIG. 3 illustrates a structure 300, including flowable layer 302, and optionally remaining material 304. As illustrated in FIG. 3, material flows to a distal surface 306 of gap 204 to thereby fill gap 204 with flowable layer 302 from a bottom/distal surface 306.

Figure 4:
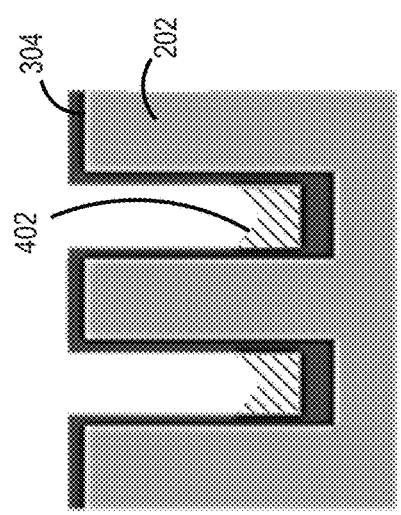

Once the flowable material is formed, the flowable layer is converted to form converted material (e.g., using a converting reactant) in a third reaction chamber. In some cases, method 100 may not include step 108, but rather include flowable layer material, which may solidify at the process temperature or when cooled—e.g., to room temperature. FIG. 4 illustrates a structure 400, including converted material 402 that can be formed during step 108.

When used, step 108 includes converting flowable layer or flowable layer material to another material, which may be less flowable than the flowable layer and/or include desired properties, such as insulating properties, conductivity, etch resistance, or the like. Step 108 can include a thermal excitation, remote plasma excitation, indirect plasma excitation, and/or direct plasma excitation to form activated species using the converting reactant.

Specific process conditions during step 108 can vary depending on, for example, a composition of the flowable layer material. By way of examples, a temperature (e.g., of a substrate or a substrate support) within a reaction chamber can be between about 50° C. and about 200° C. or about 200° C. and about 600° C. or about 100 C and 700 C or about 200 C and about 400 C; a pressure within the reaction chamber can be about 1 to about 4 or about 4 to about 100 Torr during step 108. A duration for step 108 can be between about 10 and about 3600 seconds.

The converting reactant can comprise one or more of a noble gas, such as helium or argon; an oxidizing reactant; a nitriding reactant; a carbon-containing reactant; and a reducing reactant. By way of examples, the oxidizing reactant can comprise an oxygen-containing gas, such as oxygen ($O_2$), $O_3$, $H_2O$, or the like; the nitriding reactant can comprise a nitrogen-containing gas, such as nitrogen ($N_2$), ammonia, hydrazine, (e.g., alkyl) substituted hydrazine, forming gas, or the like; the carbon-containing reactant can include, for example, $CH_4$ or the like; the reducing reactant can include, for example, a hydrogen-containing gas, such as $H_2$ or the like.

As illustrated in FIG. 1, method 100 can also include a heat treatment step 110, which can be performed in a fourth reaction chamber of the reactor system. Heat treatment step 110 can be, for example, an anneal step. A temperature and gas within the (e.g., fourth) reaction chamber can depend on desired material properties and of the composition of the converted material. In accordance with examples of the disclosure, step 110 includes performing a rapid thermal anneal (RTA) step. The RTA step can include exposing the substrate to infrared radiation for a brief time period (e.g., from at least 100 ms to at most 10 s). During an RTA, a substrate's surface can be heated to, e.g., a temperature from at least 200° C. to at most 700° C. In accordance with additional examples, a substrate can be heated—e.g., using a susceptor heater and/or as a soak heat treatment process. In these cases, the substrate can be heated to a temperature of at least 100° C. to at most 600° C. for a period of about 5 to about 600 seconds. The heat treatment can be performed in an atmosphere comprising one or more of a noble gas, an oxygen-containing gas, a nitrogen-containing gas, a carbon-containing gas, and a hydrogen-containing gas, such as the exemplary gasses noted above in connection with step 108.

Figure 5:
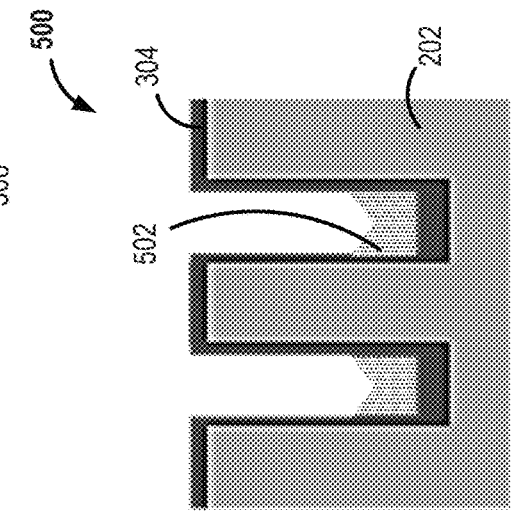

FIG. 5 illustrates a structure 500 after step 110. Structure 500 includes substrate 202 and heat treated material 502. Heat treated material 502 can be or include converted material—e.g., material that has been annealed. Additionally or alternatively, treated material 502 can include converted material that has been oxidized, reduced, carbonized, densified, or the like during step 110.

In accordance with examples of the disclosure, a cycle comprises the steps of forming the material layer on the surface of the substrate within the first reaction chamber, exposing the substrate to the halogen reactant in the second reaction chamber, exposing the substrate to the converting reactant in a third reaction chamber, and heat-treating the converted material in the fourth reaction chamber. In accordance with further examples, a cycle comprises the steps of forming the material layer on the surface of the substrate within the first reaction chamber, exposing the substrate to the halogen reactant in the second reaction chamber, and exposing the substrate to the converting reactant in the third reaction chamber. And, in accordance with yet further examples, a cycle includes the steps of forming the material layer on the surface of the substrate within the first reaction chamber, exposing the substrate to the halogen reactant in the second reaction chamber, and heat-treating the halogenated material in another reaction chamber. In any case, the cycle can be repeated one or more times—e.g., by moving the substrate between the respective reaction chambers—to at least partially (e.g., fully) fill a gap without a seam or a void.

Figure 6:
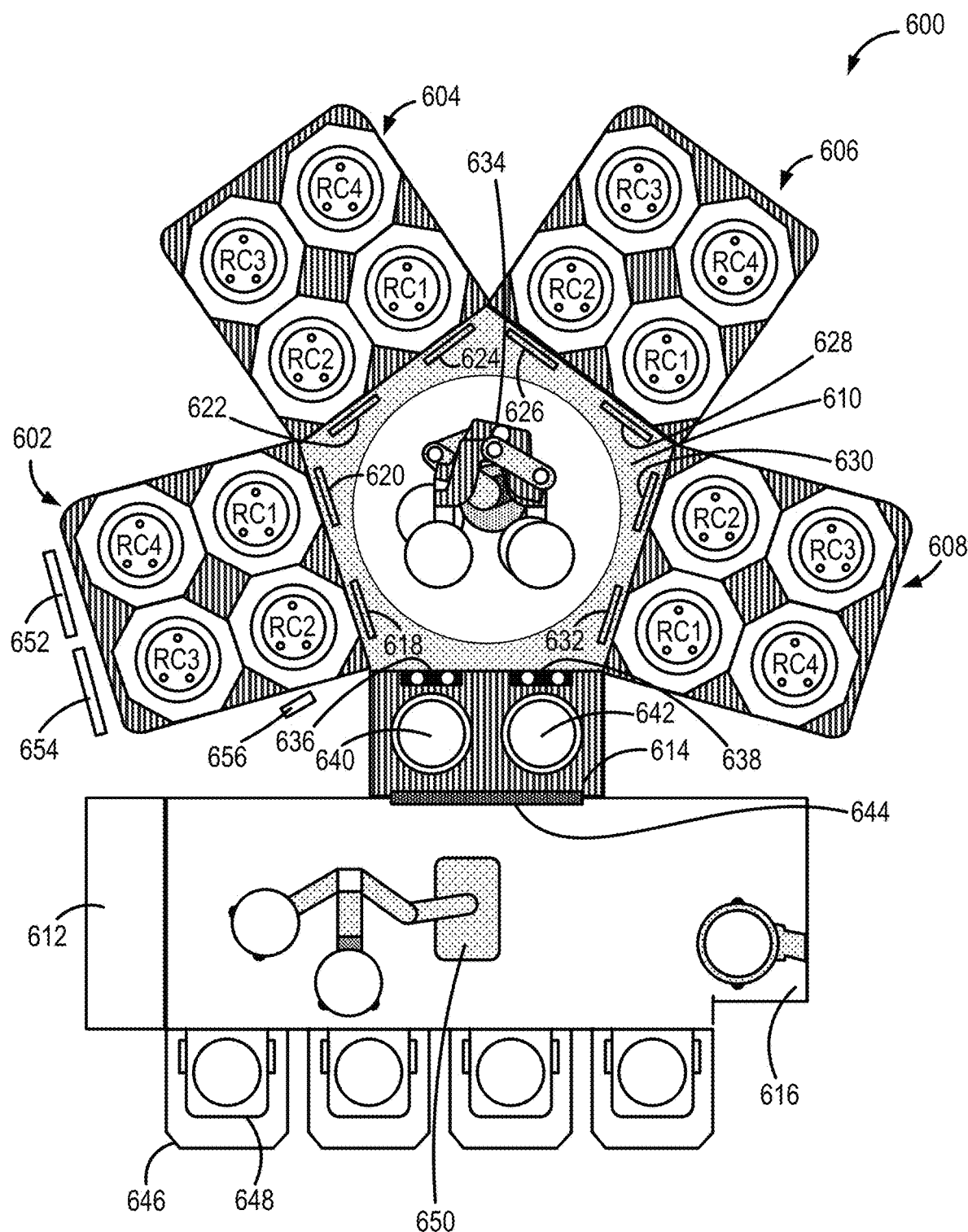
FIG. 6 illustrates a reactor system in accordance with examples of the disclosure.

FIG. 6 illustrates an exemplary reactor system 600 in accordance with examples of the disclosure. Reactor system 600 includes a plurality of process modules 602-608, a substrate handling chamber 610, a controller 612, a load lock chamber 614, and an equipment front end module 616. Rector system 600 can be used to perform method 100.

In the illustrated example, each process module 102-108 includes four reaction chambers RC1-RC4, each of which can form a reactor within the module. Unless otherwise noted, RC1-RC4 can be in any suitable order. Further, process modules in accordance with examples of the disclosure can include any suitable number of reaction chambers. Various process modules within a reaction system can be configured the same or differently.

In accordance with examples of the disclosure, at least one process module 602-608 comprises a first reaction chamber RC1, a second reaction chamber RC2, a third reaction chamber RC3, and optionally a fourth reaction chamber RC4. In accordance with further examples, two or more (e.g., 2, 3, or 4) of process modules 602-608 include a first reaction chamber RC1, a second reaction chamber RC2, a third reaction chamber RC3, and optionally a fourth reaction chamber RC4.

In accordance with examples of the disclosure, at least one process module 602-608 comprises a first reaction chamber RC1 configured to deposit a material layer, a second reaction chamber RC2 configured to expose the material layer to a halogen reactant to thereby form a flowable layer, and a third reaction chamber RC3 configured to expose the flowable layer to a converting reactant to form a converted material. In accordance with further examples, at least one process module 602-608 comprises a fourth reaction chamber RC4 configured to heat treat the converted material. In accordance with examples of the disclosure, first reaction chamber RC1, second reaction chamber RC2, third reaction chamber RC3, and fourth reaction chamber RC4 form part of a cluster tool or module, such that a substrate can move between the first reaction chamber, the second reaction chamber, the third reaction chamber, and the fourth reaction chamber without an air break. Further, if desired, a substrate can move between process modules 602-608 without an air break.

First reaction chamber RC1, second reaction chamber RC2, and third reaction chamber RC3 can thus be used to form a layer converted material. In some cases, two or more (e.g., 2, 3, or 4) process modules are similarly configured. Alternatively, two or more (e.g., all) reaction chambers within a process module can perform the same reaction (e.g., formation of a material layer, expositing the material layer to a halogen reactant, expositing the flowable material to a converting reactant, or heat treatment).

Substrate handling chamber 610 couples to each process module 602-608. By way of example, substrate handling chamber 610 can couple to each process module 602-608 via gate valves 618-632. In accordance with examples of the disclosure, process module 602-608 can be coupled to and decoupled from substrate handling chamber 610.

Substrate handling chamber 610 can be used to move substrates between load lock chamber 614 and one or more process modules 602-608 and/or between process modules 602-608. Substrate handling chamber 610 can include a back end robot 634. Back end robot 634 can transport substrates from load lock chamber 614 (e.g., stages 640, 642 therein) and any one of any susceptors within any of the reaction chambers. Back end robot 634 can be or include, for example, a multi joint robot. By way of example, back end robot 634 can retrieve and move a substrate to be transported using electrostatic or vacuum force. Back end robot 634 can be, for example, an end effector.

Controller 612 can be configured to perform one or more steps or functions as described herein. Controller 612 includes electronic circuitry and software to selectively operate valves, manifolds, heaters, pumps and other components included in reactor system 600. Such circuitry and components operate to provide gasses, regulate temperature, and the like to provide proper operation of reactor system 100. Controller 612 can include modules, such as software and/or hardware components, which perform certain tasks. A module may be configured to reside on the addressable storage medium of the control system and be configured to execute one or more processes, such as a method described herein.

Load lock chamber 614 is connected to substrate handling chamber 610 via, for example, gate valves 636, 638 and to equipment front end module 616. Load lock chamber 614 can include one or more, e.g., two stages 640, 642 for staging substrates between equipment front end module 616 and substrate handling chamber 610.

Equipment front end module 616 is coupled to load lock chamber 614 via an opening 644. Front end module 616 can suitably include one or more load ports 646. Load ports 646 can be provided to accommodate a substrate carrier, such as a front opening unified pod (FOUP) 648. A robot 650 provided in the equipment front end module 616 can transport one or more (e.g., two at a time) substrates between FOUP 648 and the stages 640, 642 within load lock chamber 614.

Reactor system 100 can include one or more heaters 652, 654. Heaters 652 can be configured as susceptor heaters and/or as heaters (e.g., lamps) suitable for use with RTA. Heaters 652, 654 can be configured to heat a substrate or a surface thereof to desired temperatures, such as temperatures noted herein.

Reactor system 100 can additionally include one or more remote plasma units 656 fluidly coupled to one or more reaction chambers RC1-RC4 (e.g., the second reaction chamber). Additionally or alternatively, one or more of RC1-RC4 can include direct or indirect plasma apparatus.

Figure 7:
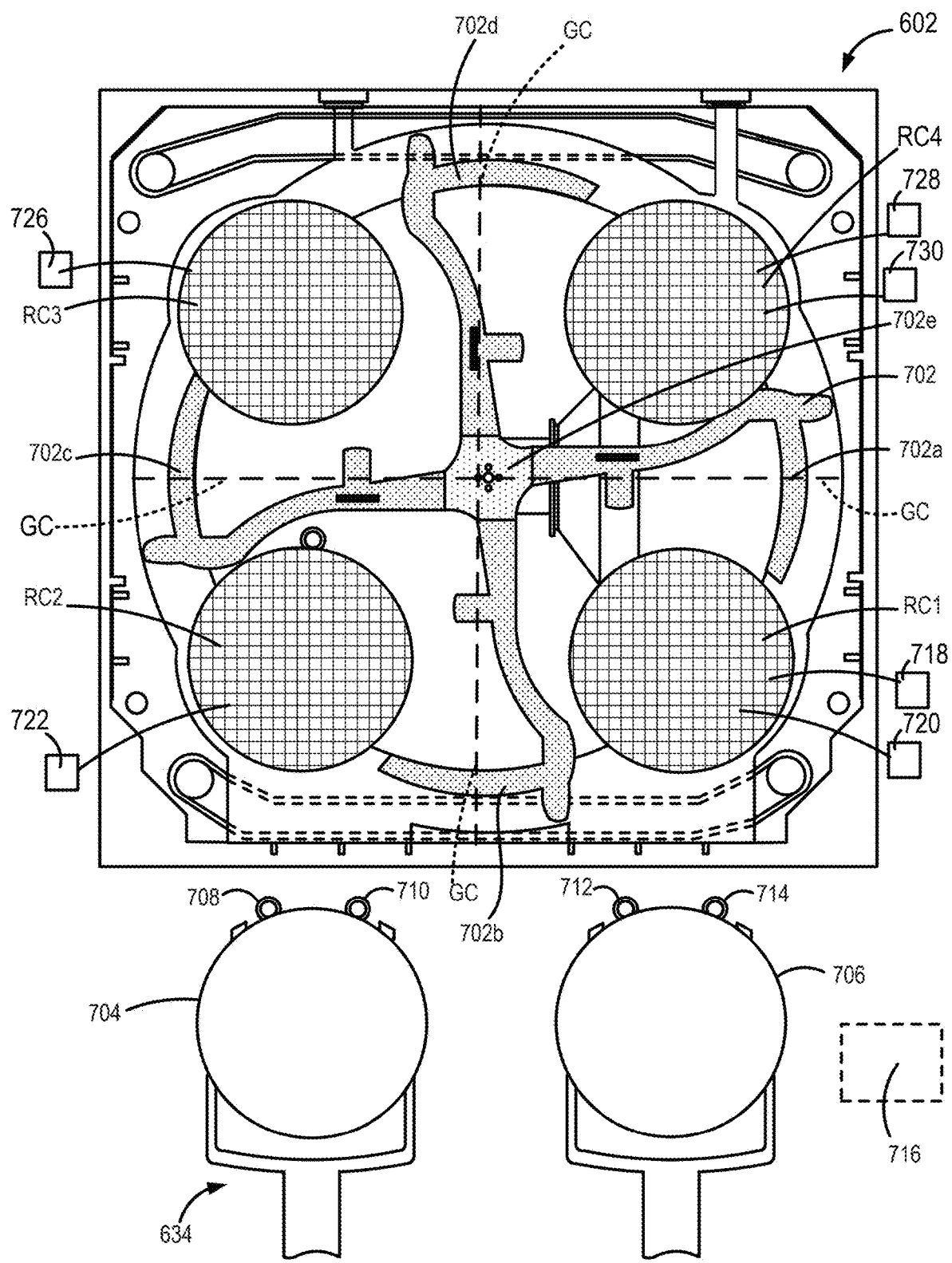
FIG. 7 illustrates a top cut-away view of an exemplary process module in accordance with examples of the disclosure.

FIG. 7 illustrates a top cut-away view of an exemplary process module 602 in greater detail. In the illustrated example, process module 602 includes first reaction chamber RC1, second reaction chamber RC2, third reaction chamber RC3, and fourth reaction chamber RC4. First reaction chamber RC1 and second reaction chamber RC2 can be located at a position closer to substrate handling chamber 610 than third reaction chamber RC3 and fourth reaction chamber RC4. One or more reaction chambers RC1-RC4 can be separated from each other using one or more of a gas curtain (GC) and one or more physical barriers having an area or opening (which may be sealable) to allow substrates therethrough. Additionally or alternatively, product and process gas flows can be configured, such that desired reactions take place within and substantially only within each reaction chamber. In accordance with examples of the disclosure, substrate handling chamber 610 can communicate directly or via a gate valve(s) (e.g., gate valves 618, 620) with RC1 and RC2.

In the illustrated example, process module 602 includes a transfer arm 702 to move substrates between reaction chambers RC1-RC4 within process module 602. Transfer arm 702 can include a first through n arms for each reaction chamber. For example, transfer arm 702 can include a first arm 702a, a second arm 702b, a third arm 702c, a fourth arm 702d, and a shaft 702e. First arm 702a, second arm 702b, third arm 702c, and fourth arm 702d are supported by shaft 702e, and rotated by rotation of the shaft 702e. Arms 702a-702d are located between the reaction chambers or inside a specific reaction chamber according to the rotational state of shaft 702e. Transfer arm 702 can be used to provide a substrate onto a susceptor within a reaction chamber and take out a substrate on the susceptor. Transfer arm 702 can serve as a rotation arm for moving a substrate in one of the first to fourth reaction chambers RC1-RC4 into another reaction chamber. Such a rotation arm rotates, for example, counterclockwise by degrees calculated by 360/number of reaction chambers. Process modules 604-608 may be configured to have the same or similar configuration as process module 602, illustrated in FIG. 7.

In accordance with further examples of the disclosure, as illustrated in FIG. 7, back end robot 634 can transfer substrates 704, 706 to/from RC1 and RC2. One or more sensors 708-714 can be provided in a region between substrate handling chamber 110 and the process module 602. For example, two sensors 708, 710 can be provided in front of first reaction chamber RC1, and two sensors 212, 214 can be provided in front of second reaction chamber RC2.

Process module 602 can also include an automatic substrate sensing unit for determining whether a substrate has passed a predetermined position when the substrate is transferred from substrate handling chamber 610 to first reaction chamber RC1 or second reaction chamber RC2 by back end robot 634. The automatic wafer sensing unit can include, for example, the aforementioned sensors 708-714 and a transfer module controller (TMC) 716 connected to the sensors 708-714. TMC 716 can be located, for example, under substrate handling chamber 610.

More detailed descriptions of exemplary process modules suitable for process modules 102-108 and exemplary systems are provided in U.S. Pat. No. 10,777,445 in the name of Kazuhiro Nishiwaki, issued Sep. 15, 2020; U.S. Pat. No. 10,332,767 in the name of Taku Omori, issued Jun. 25, 2019; and U.S. application Ser. No. 17/169,440, filed Feb. 6, 2021, and titled REACTOR SYSTEM WITH MULTI-DIRECTIONAL REACTION CHAMBER, the contents of which are hereby incorporated herein by reference.

One or more precursor sources, one or more reactant sources, and/or one or more inert or noble gas sources can be coupled to each reaction chamber RC1-RC4. In the illustrated example, a first precursor source 718 and a first reactant source 720 are fluidly coupled to RC1; a halogen reactant source 722 is fluidly coupled to RC2; a converting reactant source 726 is fluidly coupled to RC3; and a treatment reactant source (e.g., one or more of an oxygen-containing gas source, a nitrogen-containing gas source, a carbon-containing gas source, and a hydrogen-containing gas source) 228 and/or a noble gas source 730 is fluidly coupled to RC4. One or more of the gas sources may be coupled to or include a remote plasma unit.

Figure 8:
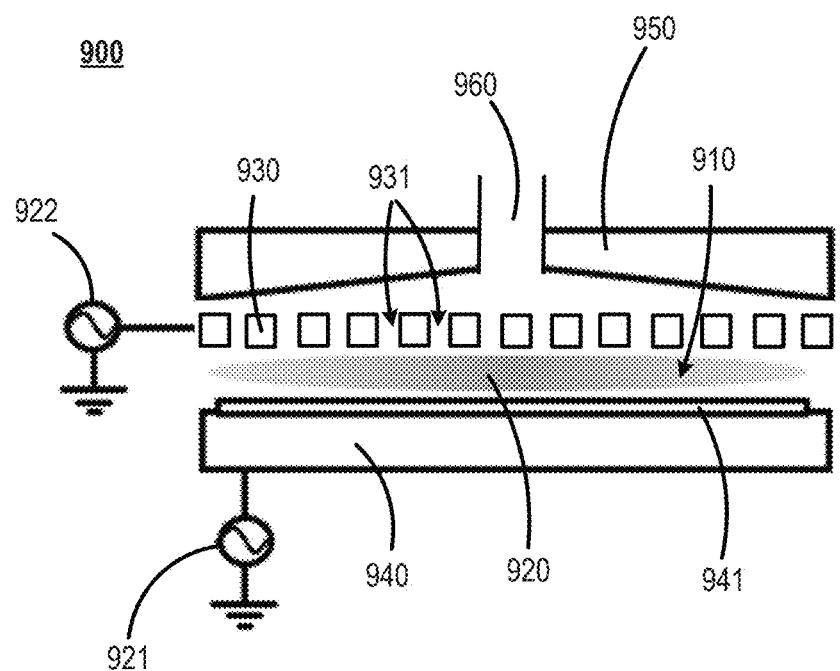
FIGS. 8-10 illustrate reactors suitable for use in connection with the present disclosure.

As noted above, reaction chambers RC1-RC4 can be configured in a variety of ways. FIG. 8 illustrates a reactor 900 suitable for use in connection with one or more of RC1-RC4 in accordance with examples of the disclosure. Reactor 900 includes a reaction space 910, in which a plasma 920 is generated. In particular, plasma 920 is generated between a showerhead injector 930 and a substrate support 940.

In the configuration shown, reactor 900 comprises two alternating current (AC) power sources: a high frequency power source 922 and a low frequency power source 921. In the configuration shown, the high frequency power source 922 supplies radio frequency (RF) power to the showerhead injector, and the low frequency power source 921 supplies an alternating current signal to the substrate support 940. The radio frequency power can be provided, for example, at a frequency of 13.56 MHz or higher. The low frequency alternating current signal can be provided, for example, at a frequency of 2 MHz or lower.

Process gas comprising precursor, reactant, or both, is provided through a gas line 960 to a (e.g., conical) gas distributor 950. The process gas then passes through holes 931 in the showerhead injector 930 to the reaction space 910.

Whereas the high frequency power source 922 is shown as being electrically connected to the showerhead injector, and the low frequency power source 921 is shown as being electrically connected to the substrate support 940, other configurations are possible as well. For example, in some embodiments (not shown), both the high frequency power source and the low frequency power source can be electrically connected to the showerhead injector; or both the high frequency power source and the low frequency power source can be electrically connected to the substrate support; or the high frequency power source can be electrically connected to the substrate support, and the low frequency power source can be electrically connected to the showerhead injector.

Figure 9:
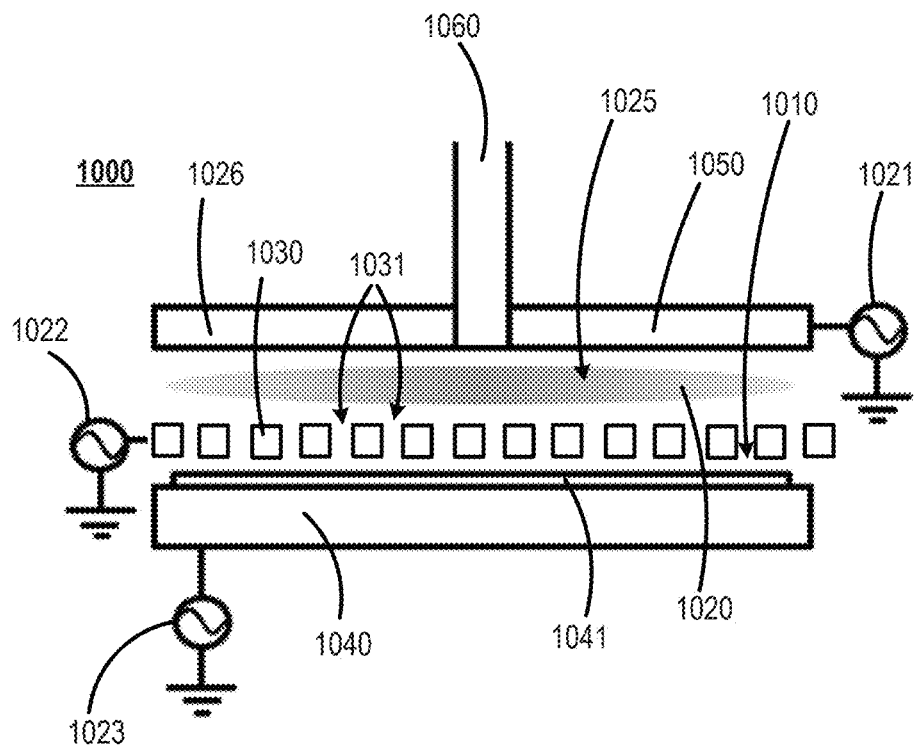

FIG. 9 shows a schematic representation of another embodiment of a reactor 1000, suitable for use in connection with one or more of RC1-RC4. Reactor 1000 comprises a reaction space 1010 which is separated from a plasma generation space 1025 in which a plasma 1020 is generated. In particular, the reaction space 1010 is separated from the plasma generation space 1025 by a showerhead injector, and the plasma 1020 is generated between the showerhead injector 1030 and a plasma generation space ceiling 1026.

In the configuration shown, the system 1000 comprises three alternating current (AC) power sources: power source 1021, power source 1022, and power source 1033, each of which can be high or low frequency. In the configuration shown, the power source 1021 supplies (e.g., high frequency) plasma power to the plasma generation space ceiling 1026, power source 1022 supplies a (e.g., high frequency) power signal to the showerhead injector 1030, and power source 1023 supplies a (e.g., lower frequency) power signal to the substrate support 1040. When power source 1022 is a low frequency power source, power source 1022 can produce a remote plasma version (e.g., neutral beam plasma) of FIG. 9 and power source 1023 may not have a function. A substrate 1041 is provided on the substrate support 1040. The high frequency power can be provided, for example, at a frequency of 13.56 MHz or higher. The low frequency alternating current signal can be provided, for example, at a frequency of 2 MHz or lower. When low frequency power sources 1022 is used in combination with low frequency power sources 1023, a plasma can form between substrate 1041 and showerhead injector 1030—e.g., during a deposition process. For example, power source 1022 can be used for direct for deposition, and power source 1021 can be used to form activated species from, for example, a halogen reactant.

Process gas comprising precursor, reactant, or both, can be provided through a gas line 1060 that passes through the plasma generation space ceiling 1026, to the plasma generation space 1025. Active species, such as ions and/or radicals generated by the plasma 1025 from the process gas, pass through holes 1031 in the showerhead injector 1030 to the reaction space 1010.

Figure 10:
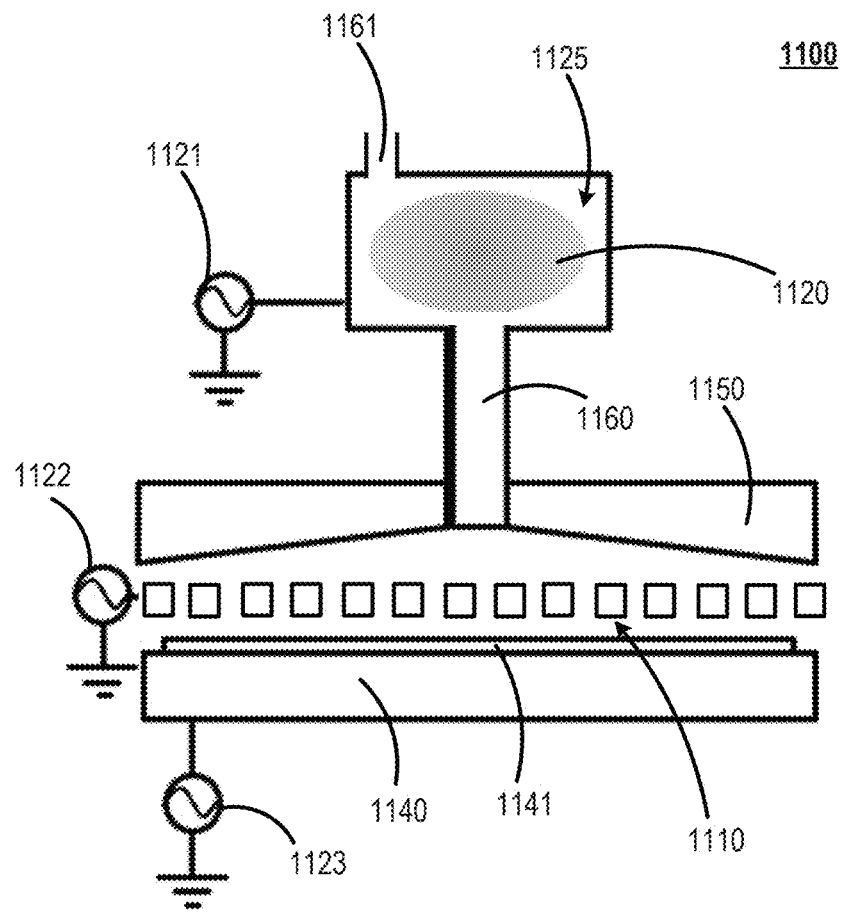

FIG. 10 shows a schematic representation of another embodiment of reactor 1100 suitable for one or more of RC1-RC4. Reactor 1100 comprises a reaction space 1110, which is operationally connected to a remote plasma source 1125, in which a plasma 1120 is generated. Any sort of plasma source can be used as a remote plasma source 1125, for example, an inductively coupled plasma, a capacitively coupled plasma, or a microwave plasma.

In particular, active species are provided from the plasma source 1125 to the reaction space 1110 via an active species duct 1160, to a conical distributor 1150, through holes 1131 in a shower plate injector 1130 to the reaction space 1110. Thus, active species can be provided to the reaction space in a uniform way.

In the configuration shown, the reactor 1100 comprises three alternating current (AC) power sources: a remote plasma power source 1121 and power sources 1122, 1123; e.g., a high frequency power source 1122 and a low frequency power source 1123. In the configuration shown, the high frequency power source 1122 supplies radio frequency (RF) power to showerhead injector 1130, and the low frequency power source 1123 supplies an alternating current signal to the substrate support 1140. A substrate 1141 is provided on the substrate support 1140. The radio frequency power can be provided, for example, at a frequency of 13.56 MHz or higher—e.g., 2.45 GHz for microwave remote plasmas or 25 MHz, or 50 MHz, or 100 MHz (1121, 1122). The low frequency alternating current signal of the first and second low frequency power sources (1123) can be provided, for example, at a frequency of 100 kHz or lower, or at a higher frequency such as at a frequency of 5 MHz or lower, such as at a frequency of 2 MHz.

In some embodiments (not shown), an additional high frequency power source can be electrically connected to the substrate support. Thus, a direct plasma can be generated in the reaction chamber.

Process gas comprising precursor, reactant, or both, can be provided to the plasma source 1125 by means of a gas line 1161. Active species, such as ions and/or radicals generated by the plasma 1125 from the process gas, are guided to the reaction chamber 1110.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of filling a gap on a surface of a substrate, the method comprising the steps of:
   providing a substrate within a first reaction chamber, the substrate comprising the gap;
   forming a material layer on a surface of the substrate within the first reaction chamber;
   exposing the material layer to a halogen reactant in a second reaction chamber to thereby form a flowable layer comprising a halogen within the gap; and
   exposing the flowable layer to a converting reactant in a third reaction chamber to form a converted material within the gap.

2. The method of claim 1, further comprising a step of heat-treating the converted material in a fourth reaction chamber.

3. The method of claim 2, wherein the step of heat treating comprises a rapid thermal anneal process.

4. The method of claim 2, wherein a cycle comprises the steps of forming the material layer on the surface of the substrate within the first reaction chamber, exposing the substrate to the halogen reactant in the second reaction chamber, exposing the substrate to the converting reactant in the third reaction chamber, and heat-treating the converted material in the fourth reaction chamber, and wherein the cycle is repeated one or more times.

5. The method of claim 2, wherein the first reaction chamber, the second reaction chamber, the third reaction chamber, and the fourth reaction chamber form part of a cluster tool.

6. The method of claim 2, wherein the steps of forming the material layer on the surface of the substrate within the first reaction chamber, exposing the substrate to the halogen reactant in the second reaction chamber, exposing the substrate to the converting reactant in the third reaction chamber, and heat-treating the converted material in the fourth reaction chamber are performed without an air break.

7. The method of claim 1, wherein the material layer comprises one or more of a metal, an alloy, a metal oxide, an elemental semiconductor, and a compound semiconductor.

8. The method of claim 1, wherein the halogen reactant comprises one or more of fluorine, chlorine, bromine, and iodine.

9. The method of claim 1, wherein the converting reactant comprises one or more of a noble gas, an oxidizing reactant, a nitriding reactant, and a reducing reactant.

10. The method of claim 1, wherein the halogen reactant comprises activated species formed within a remote plasma unit fluidly coupled to the second reaction chamber.

11. The method of claim 1, wherein the step of forming the material layer comprises a cyclical deposition process.

12. The method of claim 1, wherein the step of exposing the flowable layer to the converting reactant comprises a thermal process, wherein a temperature of the substrate during the thermal process is between about 100° C. and about 700° C. or between about 200° C. and about 400° C. for a period between about 10 and about 3600 seconds.

13. The method of claim 1, wherein the converting reactant comprises one or more of a noble gas, an oxygen-containing gas, a nitrogen-containing gas, a carbon-containing gas, and a hydrogen-containing gas.

* * * * *